United States Patent

Koken et al.

Patent Number: 5,914,612
Date of Patent: Jun. 22, 1999

[54] TWEEZER PROBE AND ARM THEREFOR

[75] Inventors: Claus Koken, Barsbuttel; Rolf Heuchert; Günther Ruch, both of Hamburg; Steffen Zierau, Reinbek, all of Germany

[73] Assignee: Fluke Corporation, Everett, Wash.

[21] Appl. No.: 08/674,409

[22] Filed: Jul. 2, 1996

Related U.S. Application Data

[63] Continuation of application No. 08/418,307, Apr. 7, 1995, abandoned.

[30] Foreign Application Priority Data

Apr. 11, 1994 [EP] European Pat. Off. ............... 94302520

[51] Int. Cl.[6] ........................... G01R 1/067; G01R 1/073
[52] U.S. Cl. ............................ 324/754; 324/72.5
[58] Field of Search ................... 324/754, 72.5, 324/762, 757; 439/269.1, 482, 822, 912, 729; 606/43; 294/99.2

[56] References Cited

U.S. PATENT DOCUMENTS

| | | | |
|---|---|---|---|
| 1,071,978 | 9/1913 | White | 606/43 |
| 2,417,530 | 3/1947 | Weiser | 606/43 |
| 3,182,257 | 5/1965 | Linkowski | 324/72.5 |
| 4,055,806 | 10/1977 | Patel | 324/754 |
| 4,078,569 | 3/1978 | Hoshi | 606/43 |
| 4,161,692 | 7/1979 | Tarzwell | 324/754 |
| 4,174,713 | 11/1979 | Mehl | 606/43 |
| 4,650,933 | 3/1987 | Benda et al. | 324/72.5 |
| 4,749,362 | 6/1988 | Hoffman et al. | 439/912 |
| 4,791,363 | 12/1988 | Logan | 324/754 |
| 4,894,612 | 1/1990 | Drake et al. | 324/754 |
| 5,049,148 | 9/1991 | Mehl | 606/43 |
| 5,247,246 | 9/1993 | Van Loan et al. | 324/754 |
| 5,364,394 | 11/1994 | Mehl | 606/43 |
| 5,407,368 | 4/1995 | Strand et al. | 439/729 |
| 5,574,359 | 11/1996 | Arthur | 324/72.5 |

*Primary Examiner*—Ernest F. Karlsen
*Attorney, Agent, or Firm*—George T. Noe

[57] ABSTRACT

A tweezer probe comprises a pair of arms (10) each made of a multi-layer printed circuit board. The outer conductive layers (20,32) on each arm are etched to form a shield region (36) and a tip contact (34). The tip contacts (34) are connected to inner conductive layers (24,28) by through-hole plating, the inner layers being etched to form connector wires (40) extending along the length of the arms to a connector region where leads (8) are attached. The arms (10) are substantially rigidly mounted together, with an adjustment mechanism (14,72,74,76) being provided to alter the angle between the arms, the tips being moveable towards each other against the bias provided by the inherent resilience of the arms.

11 Claims, 2 Drawing Sheets

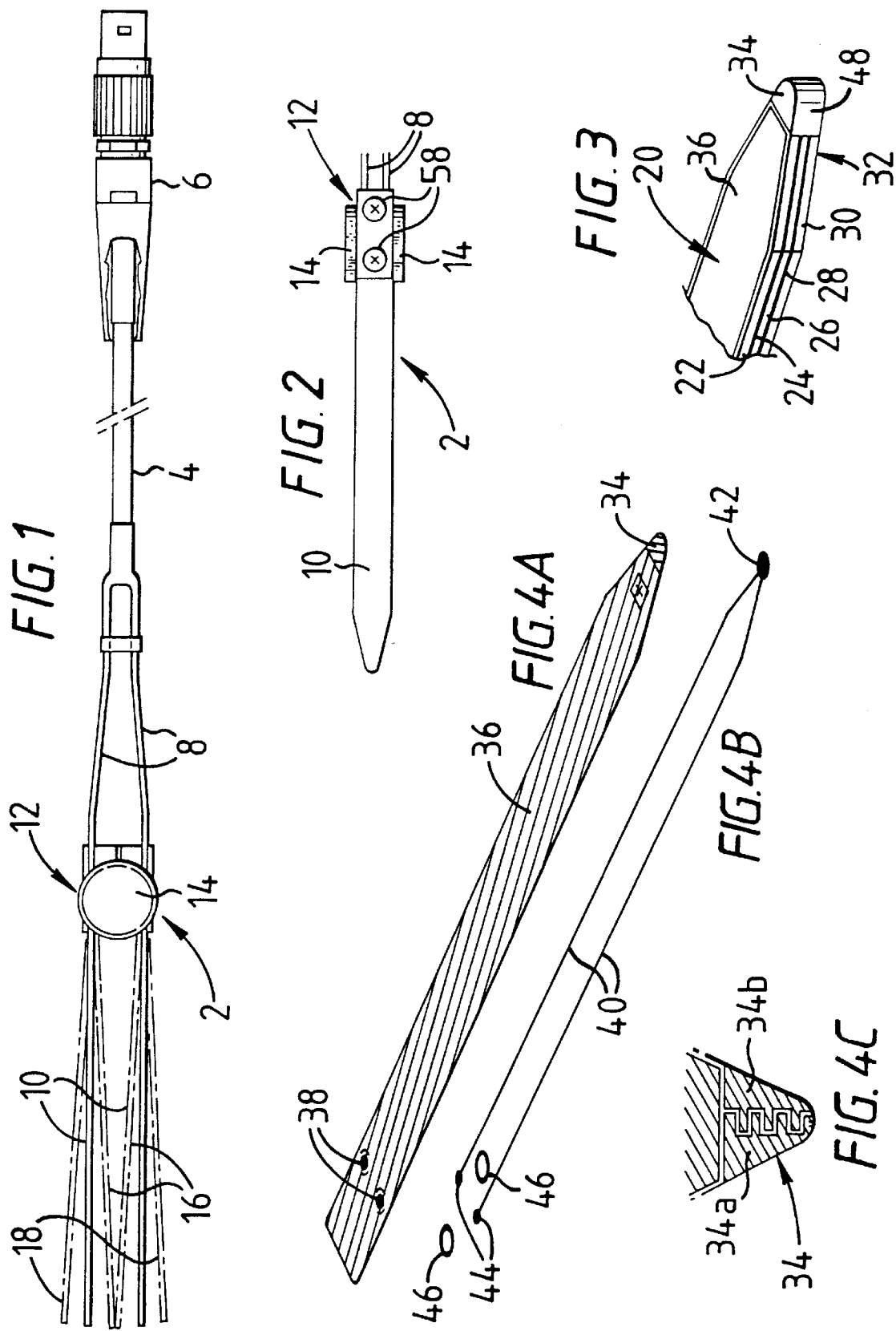

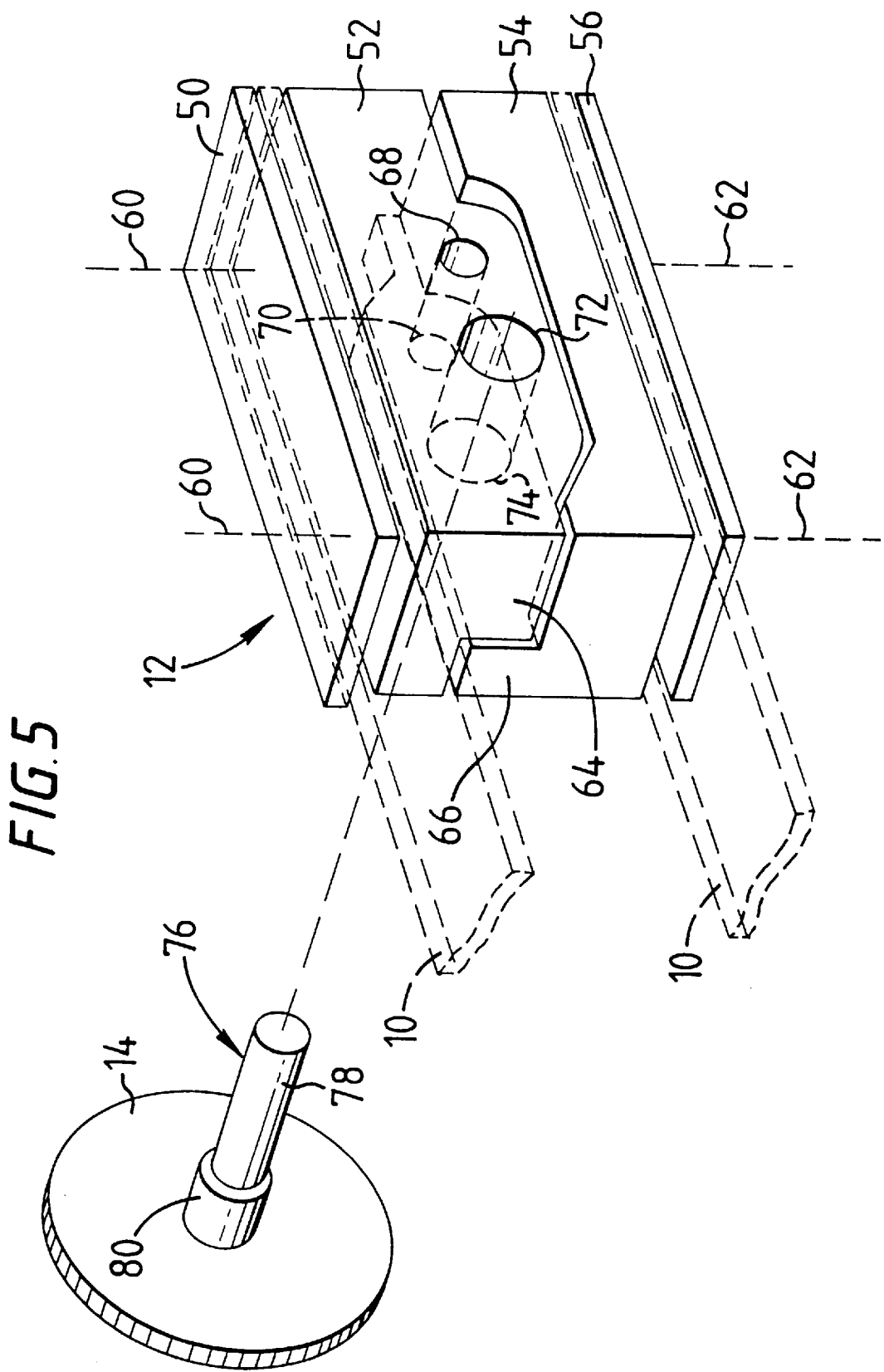

TWEEZER PROBE AND ARM THEREFOR

This application is a continuation of prior application Ser. No. 08/418,307 filed on Apr. 7, 1995, now abandoned.

This invention relates to measurement probes, and particularly tweezer Probes which consist of a pair of arms having conductive tips which can be squeezed together against a bias so as to bring the tips into contact with a circuit element to be tested. Each tip is connected to a respective lead, or in some known versions the tip is split to form two regions each connected to a respective lead, both regions being in use brought into contact with the same test point so that measurements can be made using the Kelvin contacts technique.

However, tweezer probes are made from a large number of precision moulded parts which are expensive to manufacture and assemble. It is difficult to avoid lateral displacement of the arms which causes the tips to become misaligned; this results in particular problems with split tips.

A further problem arises in that the capacitance characteristics of the tweezer probe may change as the probe arms are moved towards each other due to the changing distance between the connecting wires within the probe arms.

According to one aspect of the invention there is provided an arm for a tweezer probe, the arm being formed of a printed circuit board having a conductive tip portion on a face thereof, and a connecting portion formed of a conductive layer extending from the tip portion to a connector region for attachment to a lead.

The invention thus extends to a tweezer probe comprising a pair of arms according to the first-mentioned aspect of the invention. It is proposed that the tweezer probe should comprise a pair of such arms mounted together with their tip portions facing each other. Preferably, the mounting is substantially rigid, and the tip portions can be moved together against the bias provided by the inherent resilience of the arms.

Preferably, the connecting portion is formed by etching of an inner conductive layer of a multi-layer board, the tip portion preferably being formed by etching of a outer layer. Preferably, the majority of the outer layer is left as shielding. There may be a corresponding tip portion and shielding area on the opposite side of the arm. A further, inner conductive layer may be provided to form an additional connecting portion. The tip portion or portions can be connected to the connecting portion or portions by through-hole plating.

By forming a tweezer probe arm from a printed circuit board, it is possible to make the arm much more easily and cheaply than in prior art tweezers. Furthermore, assembly of the probe is made easier because it is possible to rely on the inherent resilience of the arms for biassing, rather than providing a separate spring or the like. This in turn allows a substantially rigid mounting of the arms, which inhibits lateral relative movement of the tips so that there is less chance of misalignment. Such misalignment is also inhibited by the fact that the arms are substantially planar, and therefore cannot easily be deformed about an axis perpendicular to their planes.

In accordance with a further aspect of the invention there is provided a tweezer probe comprising a pair of resilient arms each having a conductive tip portion connected to at least one respective lead, and means remote from the tip portions for substantially rigidly mounting the arms together, whereby the tip portions can be moved towards each other against the bias provided by the inherent resilience of the arms, the mounting means including adjustment means for adjusting the relative rest positions of the tip portions.

Thus, the arrangement is facilitated by not requiring a separate biassing means, but any problems due to the limited range of movement of the tips are avoided by using the adjustment means to alter this range.

An arrangement embodying the invention will now be described by way of example with reference to the accompanying drawings, in which:

FIG. 1 is a side elevation of a tweezer probe in accordance with the invention and the connecting lead therefor;

FIG. 2 is a plan view of the tweezer probe;

FIG. 3 is a perspective view of the tip portion of one of the arms of the tweezer probe;

FIGS. 4A, B and C show conductive areas of respective layers of the arm, FIG. 4C illustrating a modification of the embodiment; and FIG. 5 is a perspective view schematically showing the mounting assembly of the tweezer probe.

Referring to FIGS. 1 and 2, a tweezer probe 2 is connected by a cable 4 to a standard connector 6, the cable 4 having individual leads 8 extending therefrom for connection to the respective arms 10 of the probe. The arms are fixed together by a mounting assembly 12 which is described in more detail later. The assembly 12 has a pair of adjustment wheels 14 disposed one on each side thereof, which can be rotated together to adjust the relative angular rest positions of the arms 10 between the positions shown in broken lines at 16 and the positions shown in broken lines at 18.

Each of the arms 10 has a conductive tip, the tips being connected to the wires 8. The arms can be squeezed together to bring the tips into contact with a circuit element to be tested. The arms are squeezed against the bias provided by their inherent resilience. This provides effective operation over a limited range of tip separations, but by making a preliminary adjustment using the wheels 14, this range can be adjusted to suit the circuit element being tested.

Each arm is formed of a multi-layer printed circuit board. Referring to FIG. 3, the circuit board comprises an upper conductive layer 20, a first insulating layer 22, a conductive layer 24, a second insulating layer 26, another conductive layer 28, a third insulating layer 30 and a lower conductive layer 32 which is not visible in FIG. 3 but which forms the opposite face of the arm 10. In a particular embodiment the insulating layers 22 and 30 are each formed of a pair of face-to-face layers. As an alternative, the arm could be formed of two separate double-sided printed circuit boards affixed face-to-face, possibly with an intervening insulating layer, or one double-sided board and one single sided board affixed face-to-face so that there are two external and one internal conductive layers.

The multi-layer printed circuit board is manufactured in a per se known manner, with each of the conductive layers 20, 26, 28 and 32 being etched to a desired configuration. The layer 20 which in use forms the inner face of the tweezer arm 10 is etched as shown in FIG. 4A to form a discrete tip portion 34. Substantially all the rest of the layer is left to form a shield area 36. At the end remote from the tip portion 34, two circular contact portions 38 are formed, each separated from the shield area by a circular gap. These contact portions are intended for connection to respective ones of the wires 8.

The layer 32 on the opposite side of the arm 10 is etched in a generally similar configuration.

Each of the inner conductive layers 24 and 28 is etched as shown in FIG. 4B. The etching forms two wires 40 each of which is connected to a tip contact pad 42 at one end and a respective lead contact pad 44 at the other end, the lead contact pads 44 being aligned with the contact pads 38 of the layers 20 and 32, and the tip contact pad 42 being aligned with the tip portions 34 of the upper and lower layers 20 and 32. There are also circular conductive portions 46 surrounding areas in which mounting holes for the arms will be drilled.

During assembly of the arms 10, a hole is drilled through the tip portions 34 of the layers 20 and 32 and the tip contact pads 42 of the inner layers 24 and 28, and these conductive regions are all interconnected by through-hole plating. Similarly the aligned contact pads 38 and 44 of the layers 20, 24, 28 and 32 are interconnected by through-hole plating.

Referring to FIG. 3, metal, e.g. gold, is deposited on the edge of the printed circuit board in the tip region, e.g. by electroless plating, the metal contacting the tip portions 34, as shown at 48. When using the probe arm, therefore, the arm can be applied to a test point using either the inner or outer faces or the surrounding edge portion of the tip.

FIG. 5 shows the mounting assembly 12. This primarily comprises an upper plate 50, an upper body 52, a lower body 54 and a lower plate 56. These may all be formed of, e.g. machined metal. One of the arms 10 is sandwiched between the upper plate 50 and the upper body 52, these being secured together by two screws 58 (see FIG. 2) located at positions shown by lines 60 (for clarity these screws and the associated holes being omitted from FIG. 5). Similarly, the lower arm 10 is secured between the lower plate 56 and the lower body 54, by means of screws located at positions indicated by lines 62. By securing each arm at two spaced locations, the arm is held more rigidly against movement about an axis normal to the plane of the arm, which might otherwise tend to cause misalignment of the tip portions.

The upper body 52 has a downwardly-projecting extension 64 which is positioned alongside an upwardly-directed extension 66 of the lower body 54. The extensions 64 and 66 have aligned holes 68 and 70 which receive a pivot pin (not shown) which secures the bodies 52 and 54 together but allows pivotal movement about an axis which is substantially perpendicular to the length of the arms 10, and disposed in a plane parallel to the planes of the arms.

The extension 64 has a circular hole 72 which is aligned with a non-circular hole 74 in the extension 66, these holes being arranged to receive a shaft 76 interconnecting the adjustment wheels 14 (only one of which is shown in FIG. 5). The shaft 76 has a circular section part 78 which locates in the hole 72 and an eccentric part 80 which locates in the hole 74. It will be appreciated that rotation of the wheels 14 causes the eccentric part 80 to rotate within the non-circular hole 74, thereby altering the spacing between the upper and lower bodies 52 and 54 at a position spaced from the axis of the pivot pin. Thus, the angle between the bodies 52 and 54, and therefore between the arms 10, is adjusted.

The bodies 52 and 54 are provided with recesses (not shown) in, respectively, their upper and lower faces, so that each body can receive a pair of wires 8, each of which is connected by soldering or pressure contact to a respective one of the contact pads 38 formed on the layer 20 of the respective arm 10.

If desired, each tip portion 34 can be split into separate regions as shown in FIG. 4C, each region 34a, 34b being connected to a respective one of the contact wires 40 in each layer 24 and 28, so that measurements can be made using the Kelvin contact technique. Preferably, the two areas are interdigitated as shown, with only a small gap therebetween, so that simultaneous contact with a circuit element can be made more reliably.

What we claim as our invention is:

1. A probe arm, comprising:

an elongate member formed of a printed circuit board and having a tapered end forming a tip;

a conductive tip portion disposed on a surface of said tapered end and extending to the edges of said tip;

a connector region for attachment to a lead spaced apart from said conductive tip portion; and a conductive layer comprising at least two wires forming a connecting portion extending from said conductive tip portion to said connector region.

2. A probe arm in accordance with claim 1 wherein said conductive layer comprises an inner layer having an insulating layer on each side thereof.

3. A probe arm in accordance with claim 1 wherein said conductive tip portion is connected to said conductive layer by through-hole plating.

4. A probe arm in accordance with claim 1 wherein said tip portion further has respective areas electrically separated from each other and connected by respective parts of said conductive layer.

5. A probe arm in accordance with claim 1 wherein said elongate member has at least one shielding layer separated from said conductive layer by an insulating layer.

6. A probe arm in accordance with claim 5 wherein said at least one shielding layer is an external layer disposed on said elongate member.

7. A probe arm in accordance with claim 6 wherein said at least one shielding layer and said tip portion are formed by etching a common layer of conductive material.

8. A probe arm in accordance with claim 1 wherein said conductive tip portion is also disposed on an opposite surface.

9. A probe arm in accordance with claim 1 further comprising a shielding layer disposed on a surface opposite to said tip portion, wherein said shielding layer and said tip portion are connected together.

10. A probe arm in accordance with claim 1 further comprising conductive cladding connected to said tip portion and surrounding the edge of the elongate member in the region of said tip portion.

11. A probe arm in accordance with claim 1 comprising a further conductive layer forming a further connecting portion extending from said tip portion to said connector region and separated from said first-mentioned conductive layer by an insulating layer.

* * * * *